(12) United States Patent
Roohparvar

(10) Patent No.: US 8,046,646 B2
(45) Date of Patent: *Oct. 25, 2011

(54) DEFECTIVE MEMORY BLOCK IDENTIFICATION IN A MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/568,912

(22) Filed: Sep. 29, 2009

(65) Prior Publication Data

US 2010/0017665 A1    Jan. 21, 2010

Related U.S. Application Data

(63) Continuation of application No. 11/454,464, filed on Jun. 16, 2006, now Pat. No. 7,610,525, which is a continuation of application No. 10/930,087, filed on Aug. 31, 2004, now Pat. No. 7,272,758.

(51) Int. Cl.
*G06F 11/00* (2006.01)
*G11C 29/00* (2006.01)
(52) U.S. Cl. ............ 714/723; 714/704; 714/710
(58) Field of Classification Search .......... 714/710, 714/711, 718, 723; 365/200, 201
See application file for complete search history.

(56) References Cited

U.S. PATENT DOCUMENTS

| | | | |
|---|---|---|---|
| 5,369,647 A | 11/1994 | Kreifels et al. | |
| 5,815,425 A | 9/1998 | Wong et al. | |
| 6,343,366 B1 | 1/2002 | Okitaka | |
| 6,477,672 B1* | 11/2002 | Satoh | 714/721 |
| 6,550,023 B1 | 4/2003 | Brauch | |
| 6,651,202 B1* | 11/2003 | Phan | 714/733 |
| 6,769,081 B1 | 7/2004 | Parulkar | |
| 6,779,140 B2 | 8/2004 | Krech, Jr. | |
| 6,785,856 B1 | 8/2004 | Parker | |
| 2004/0049724 A1 | 3/2004 | Bill | |

FOREIGN PATENT DOCUMENTS

JP     2003030934 A     1/2003

* cited by examiner

*Primary Examiner* — Jeffrey A Gaffin
*Assistant Examiner* — Daniel F McMahon
(74) *Attorney, Agent, or Firm* — Leffert Jay & Polglaze, P.A.

(57) ABSTRACT

During manufacture and testing of a memory device, a memory test is performed to determine which, if any, memory blocks are defective. A memory map of the defective blocks is stored in one of the defect-free memory blocks so that it can be read later by a controller during normal operation of the memory device. In one embodiment, the memory test is for a programmability test to determine if the memory block can be programmed. An indication of programmability is stored in each block in a predetermined location.

16 Claims, 3 Drawing Sheets

DEFECTIVE MEMORY BLOCK IDENTIFICATION IN A MEMORY DEVICE

RELATED APPLICATION

This Application is a Continuation of U.S. application Ser. No. 11/454,464 titled "DEFECTIVE MEMORY BLOCK IDENTIFICATION IN A MEMORY DEVICE," filed Jun. 16, 2006, U.S. Pat. No. 7,610,525, issued Oct. 27, 2009 which is a Continuation of U.S. application Ser. No.10/930,087, filed Aug. 31, 2004, now U.S. Pat. No. 7,272,758, issued on Sep. 18, 2007 which are commonly assigned and incorporated herein by reference.

TECHNICAL FIELD OF THE INVENTION

The present invention relates generally to memory devices and in particular the present invention relates to a flash memory devices.

BACKGROUND OF THE INVENTION

Memory devices are typically internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Unlike most semiconductor memory, flash memory devices can be sold with a limited quantity of defective memory blocks. Flash memory devices typically have a scheme to communicate the locations of the defective blocks to a controller or processor.

One such scheme employs markers at specific locations in the defective memory block. The markers are generated during the manufacturing and testing process before being sold to the user. When the user powers-up the memory device, the memory controller would go through these specific locations in memory and track the defective blocks. Since there can be over 2000 memory blocks in a typical memory device, this is considerable overhead for the controller to handle.

In another error detection scheme, the memory controller reads the memory cells in a memory block and if the data is anything but FFH it would consider that block as a bad block. The controller then moves on to the next block. When all of the block's memory locations are read as FFH, the controller considers that block as good and starts to extract the information that it expected to see in block 0.

However, if the memory defect is such that the controller is incapable of writing to any location in that block, the FFH data could not be altered from the initial erased condition. In this case, the controller would assume that the block is good since it read an FFH. Upon trying to write desired data into this block, the system would not allow it due to the write defect.

For the reasons stated above, and for other reasons stated below which will become apparent to those skilled in the art upon reading and understanding the present specification, there is a need in the art for an improved method for handling defective memory locations with minimal controller overhead.

DETAILED DESCRIPTION

Figure 1:
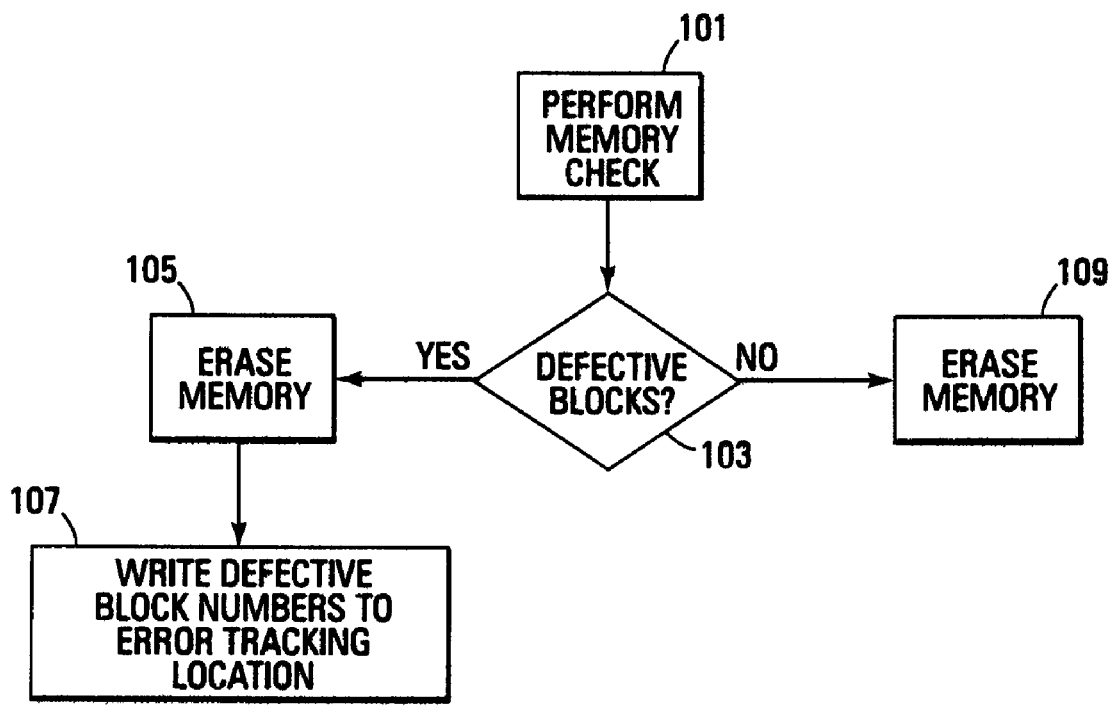
FIG. 1 shows a flowchart of one embodiment of a method for indicating defective memory blocks in a flash memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a flowchart of one embodiment of a method for identifying defective memory blocks in a flash memory device. In one embodiment, this method would be performed during the manufacturing and testing processes at the memory device manufacturer. This reduces the overhead operations required of the memory controller once the user begins operating the device.

The method performs a memory check 101 to determine if any defective blocks are present in the memory array. This memory check is well known in the art and can comprise writing a predetermined pattern to the memory cells then reading the data out. If the pattern that was read out does not match what was written, the location is considered defective and the block should be marked as defective. The error detection may also check for bitlines that are shorted together, multilevel cells that have one or more defective bits, or other types of errors. The present invention is not limited to any one error checking routine.

If a defective memory cell or cells were discovered 103, the memory is erased 105 and the block number or numbers containing the defective locations are stored 107. The memory needs to be erased due to the patterns left in the memory from the memory check process. The user typically expects to receive the memory in the erased state (i.e., FFH).

The defective block numbers can be stored at the end of an error free block. One or more data bytes may be required to store the information, depending on the number of defective blocks.

In one embodiment, the error free block is block 0 of the memory array. In an alternate embodiment, block 0 may not be the error free block. In such an embodiment, the first block determined to be defect-free is used. In another embodiment, the defective locations may be stored at the end of each block that contains at least one defective location. In this case, the stored defect indication might be the columns that are defective or some other defect indication that can be read by a user.

If no defective memory cells were discovered 103, the memory is erased 109. In this case, the memory locations all read FFH, or some other erased state, and the memory is ready for use.

One type of error in a flash memory device is that some cells cannot be programmed. They may be stuck in the erased state of FFH. With such a defect, the end user may not be able to tell that the block is bad since the FFH simply indicates that the block is erased. In this embodiment, a predetermined pattern (e.g., AAH) can be stored at some predefined location in the block (e.g., the end of the block) after the memory device has been tested and it has been determined that the block can be programmed. The end user can then go to this defect indication location and check for the predefined pattern. If the pattern is present, the user knows that the block is good and can be programmed. If the pattern is missing, the block is not programmable and is flagged as defective by the memory controller.

Flash memory devices that incorporate the embodiments of the defective memory block indication method of the present invention may be manufactured in a NOR architecture, a NAND architecture, or some other type of flash memory. In a NOR configuration, the cells are arranged in a matrix. The gates of each floating gate memory cell of the array matrix are connected by rows to wordlines and their drains are connected to column bitlines. The source of each floating gate memory cell is typically connected to a common source line.

Figure 2:
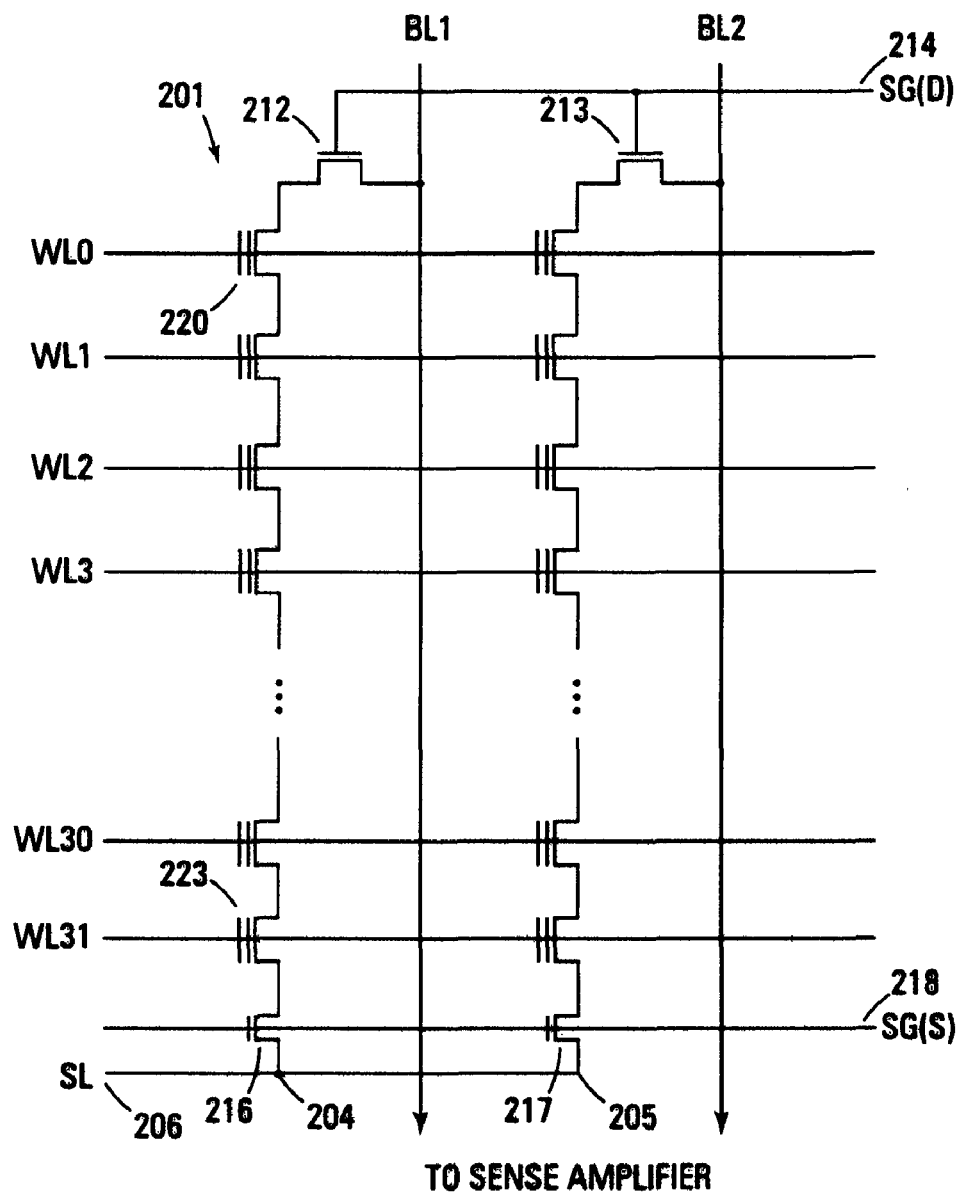
FIG. 2 shows a schematic diagram of one embodiment of a NAND flash memory array of the present invention.

FIG. 2 illustrates a simplified diagram of a typical NAND flash memory array of the present invention. The memory array of FIG. 2, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 201 arranged in series strings 204, 205. Each of the floating gate cells 201 are coupled drain to source in each series chain 204, 205. A word line (WL0-WL31) that spans across multiple series strings 204, 205 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 204, 205 to be written to or read from and operate the remaining floating gate memory cells in each series string 204, 205 in a pass through mode. Each series string 204, 205 of floating gate memory cells is coupled to a source line 206 by a source select gate 216, 217 and to an individual bitline (BL1-BLN) by a drain select gate 212, 213. The source select gates 216, 217 are controlled by a source select gate control line SG(S) 218 coupled to their control gates. The drain select gates 212, 213 are controlled by a drain select gate control line SG(D) 214.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

Figure 3:
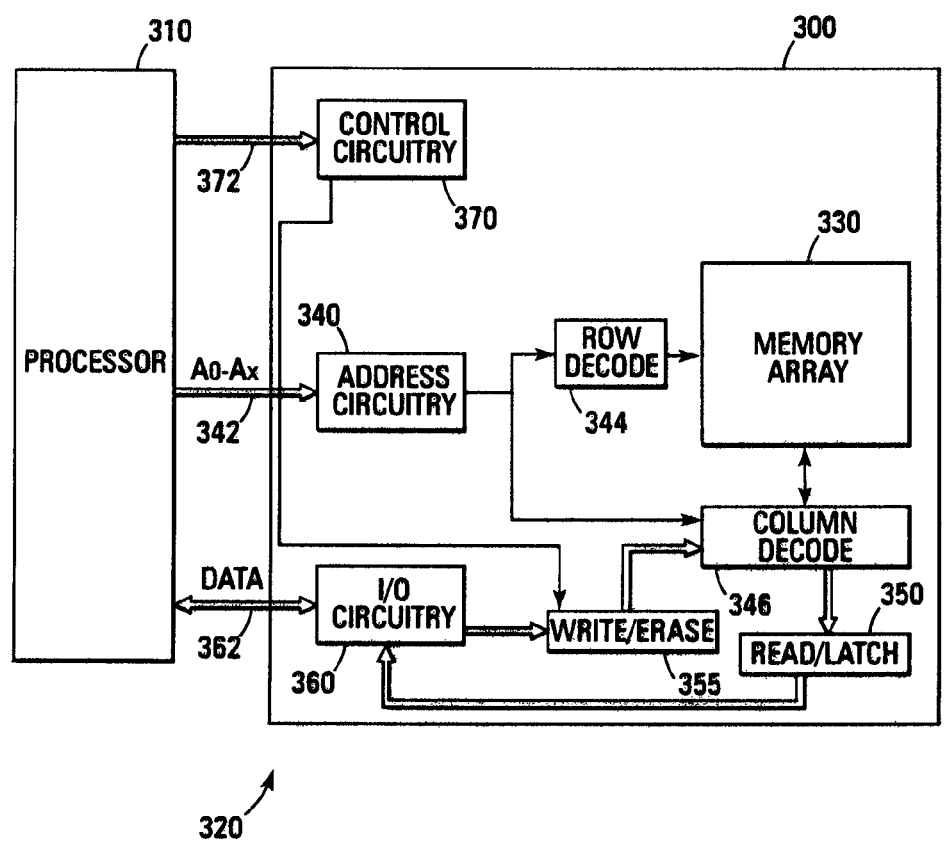
FIG. 3 shows a block diagram of one embodiment of an electronic system of the present invention.

FIG. 3 illustrates a functional block diagram of a memory device 300 that is coupled to a processor 310. The processor 310 may be a microprocessor or some other type of controlling circuitry. The memory device 300 and the processor 310 form part of an electronic system 320. The processor 310 is capable of generating memory commands to the memory device 300. The memory device 300 has been simplified to focus on features of the memory that are helpful in understanding the present invention.

The array of flash memory cells 330 may be comprised of the flash memory cells as described previously with reference to FIG. 2. In an alternate embodiment, the memory array 330 is a NOR memory array.

The memory array 330 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 340 is provided to latch address signals provided on address input connections A0-Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense/buffer circuitry 350. The sense/buffer circuitry, in one embodiment, is coupled to read and latch a row of data from the memory array 330. Data input and output buffer circuitry 360 is included for bi-directional data communication over a plurality of data connections 362 with the controller 310. Write circuitry 355 is provided to write data to the memory array.

Control circuitry 370 decodes signals provided on control connections 372 from the processor 310. These signals are used to control the operations on the memory array 330, including data read, data write (program), and erase operations. The control circuitry 370 may be a state machine, a sequencer, or some other type of controller that can execute the embodiments of the defective memory indication method of the present invention.

The control circuitry 370 knows which memory address in one or more memory blocks, depending on the embodiment, is the defect indication location. The control circuitry 370 can then read this location when powered-up by the user to determine which blocks are not usable.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, the embodiments of the memory block defect identification method of the present invention provide a flash memory device with a non-volatile indication of bad memory blocks. The memory defect indication is generated by the manufacturer during the initial testing process, thus relieving the controller from having to regenerate the defective memory block map when the memory powered up at a later date by the memory user.

In another embodiment, by writing a predetermined pattern in a predefined location in each block, the end user can check this location to determine if the block has been checked for errors. The pattern indicates the result of the error check while also indicating that the block is writable.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for indicating a defect in a memory device having a memory array, the method comprising:
   determining if a defective memory block is in the memory array; and
   storing an indication of a location of a memory block determined to be defective in a memory block, in the memory array, determined to be defect free.

2. The method of claim 1, further comprising erasing blocks of the memory device after the determining act and before the storing act.

3. The method of claim 1, wherein storing an indication of a location comprises storing a number of a memory block determined to be defective.

4. The method of claim 1, wherein storing an indication comprises storing an indication at an end of a memory block determined to be defect free.

5. The method of claim 1, wherein storing an indication comprises storing an indication in a first memory block of the memory device that is determined to be defect free.

6. The method of claim 1, wherein control circuitry configured to control operation of a memory array of the memory device reads the indication upon power-up of the memory device to determine which blocks of the memory device are not usable.

7. The method of claim 1, wherein the determining act and the storing act are performed prior to a user operating the device.

8. The method of claim 7, wherein performing the determining and storing acts prior to a user operating the device comprises performing the determining and storing acts during a testing process of a manufacturer of the memory device.

9. A method for indicating a defect in a memory device, the method comprising:
   determining if a memory block of the device has a defect; and
   if a memory block is determined to have a defect, storing an indication of the defect in the memory block determined to have the defect.

10. The method of claim 9, wherein storing an indication comprises storing a location of the defect in a portion of the memory block determined to not have a defect.

11. The method of claim 9, wherein storing an indication comprises storing an indication at an end of the memory block determined to have the defect.

12. The method of claim 9, wherein storing an indication comprises storing an indication of a column determined to have a defect.

13. A method for indicating a defect in a memory device, the method comprising:
   determining whether a block of the memory device can be programmed; and
   if it is determined that the block can be programmed, storing a particular pattern at a location in the block, wherein the particular pattern is configured to indicate that the block can be programmed.

14. The method of claim 13, further comprising checking the block for the particular pattern.

15. The method of claim 14, wherein if the particular pattern is not present at the location in the block, flagging the block as not programmable.

16. The method of claim 14, wherein if the particular pattern is not present at the location in the block, flagging the block as defective.

* * * * *